United States Patent [19]

Thylen

[11] Patent Number: 4,993,798

[45] Date of Patent: Feb. 19, 1991

[54] LASER ARRANGEMENT IN OPTICAL COMMUNICATION SYSTEM

[75] Inventor: Lars H. Thylen, Huddinge, Sweden

[73] Assignee: Telefonaktiebolaget L M Ericsson, Stockholm, Sweden

[21] Appl. No.: 401,172

[22] Filed: Aug. 31, 1989

[30] Foreign Application Priority Data

Oct. 21, 1988 [SE] Sweden .................... 8803780-9

[51] Int. Cl.$^5$ .................... G02B 6/26; G02B 6/42; H01S 3/19; G02F 1/00
[52] U.S. Cl. .................... 350/96.15; 455/610; 372/108; 350/96.16
[58] Field of Search ........... 350/96.13, 96.14, 96.15, 350/96.16; 372/6, 50, 108; 455/608, 610, 611

[56] References Cited

U.S. PATENT DOCUMENTS

| | | | |
|---|---|---|---|
| 4,143,940 | 3/1979 | Khoe | 350/96.15 |
| 4,798,429 | 1/1989 | Djupsjobacka | 350/96.14 |
| 4,831,631 | 5/1989 | Haeussler et al. | 372/50 |

FOREIGN PATENT DOCUMENTS

| | | |
|---|---|---|
| 0245085 | 5/1987 | European Pat. Off. |
| 2183417 | 6/1987 | United Kingdom |

*Primary Examiner*—Akm Ullah
*Attorney, Agent, or Firm*—Burns, Doane, Swecker & Mathis

[57] ABSTRACT

A laser arrangement in an optical communication system has a semiconductor laser (1) which includes an optical waveguide (4) whose end surface (5,8) have reflection-inhibiting coatings. The end surfaces (5, 8) are connected to a respective first connection (7, 10) of a first (2) and a second (3) directional coupler switch. Each of the directional coupler switches (2,3) have a second connection (13, 14), which is provided with mirrors (15, 16), and a third connection (11,12), which is connected to a respective optical fiber (17, 18) in the communication system. In a receiving and amplifying state, an incoming light signal (P1) is coupled by the first coupler switch (2) to the laser diode (1), where the signal is amplified by a drive current (I) and detected (24). The amplified signal (P2) is coupled to the outgoing fiber (18) by the second coupler switch (3). In a light generating state, the first directional coupler switch (2) is in its cross state and the second directional coupler switch (3) is in an intermediate state, between its two terminal states, so that the mirrors (15, 16) define a cavity which includes the laser diode (1). By modulating the drive current (I) around the lasering threshold, a signal can be transmitted on the outgoing fiber (18). Alternatively, the laser arrangement can be modulated with the aid of the directional coupler switches (2,3) for the purpose of transmitting the signal.

6 Claims, 3 Drawing Sheets

LASER ARRANGEMENT IN OPTICAL COMMUNICATION SYSTEM

TECHNICAL FIELD

The present invention relates to a laser arrangement in an optical communication system and comprising a first laser diode having an optical waveguide, whose two ends have low optical reflectance.

BACKGROUND ART

In the case of known optical communication systems, the transmitted optical signal has been converted to an electric signal, so as to enable the signal to be detected and amplified. The converted signal has been retransmitted, or a new signal has been transmitted, with the aid, e.g., of light emitting diodes or laser diodes. These known systems are relatively complicated and expensive, and consequently endeavours have been made to avoid the use of optoelectrical conversions and to increase the part played by optics in communication systems. These endeavours have resulted in difficulties, due in part to significant attenuation or damping of the optical signal, primarily in optical communication systems which included star switches, and consequently these have been provided with optical amplifiers. A communication system in which the amplification of an optical signal is effected solely in an optical fashion is described in an article "100" Mbit/s Laser diode Terminal with Optical Gain for Fibre-Optic Local Area Networks", written by A. Alping et al, and published in Electronics Letters, 13th September 1984, Vol. 20, No. 19, pages 794, 795. In an experiment, there was used a first laser diode for signal transmission and a second laser diode was used as a travelling wave amplifier for detecting the signal and retransmitting the same subsequent to amplification. Other optical systems are known in which a laser diode is used both to transmit and to amplify a signal. For example, UK Patent Application No. GB-A-2 183 417 describes a distance meter which includes a laser diode capable of transmitting a light pulse through one end surface of the diode and onto a reflective target. The other end surface of the laser diode is connected to an input of a directional coupler switch, which can be alternated between its terminal or end positions, i.e. its cross state and bar state. One output of the coupler switch is connected to a photodetector and the other output is provided with a mirror. In one terminal position of the switch, a cavity is formed between the switch mirror and one reflective end surface of the laser diode. The laser diode, which is connected to a drive source, transmits the light pulse, which is reflected by the target back to the laser diode. The directional coupler switch is switched to its other terminal state during this transmission/reflection delay time. The reflected light pulse passes the laser diode, which now functions as an amplifier. The' light pulse amplified by the laser diode is coupled to the photodetector by the switch, so that the light pulse can be detected and its delay time measured. One drawback with both of the afore-described arrangements is that they are relatively complicated and require the provision of more optical amplifiers or detectors. The distance meter taught by the aforesaid UK patent application is not suited for fibre optical communication systems, since the end surfaces of the laser amplifier reflect an incoming light signal and thereby generate undesirable disturbance signals.

DISCLOSURE OF THE INVENTION

These drawbacks are avoided with an arrangement constructed in accordance with the invention, according to which one and the same laser diode is used as a light signal transmitter, receiver and amplifier.

The invention has the characterising features set forth in the following claims.

BRIEF DESCRIPTION OF DRAWINGS

An examplifying embodiment of the invention will now be described in more detail with reference to the accompanying drawings, in which.

BEST MODE FOR CARRYING OUT THE INVENTION

Figure 1:
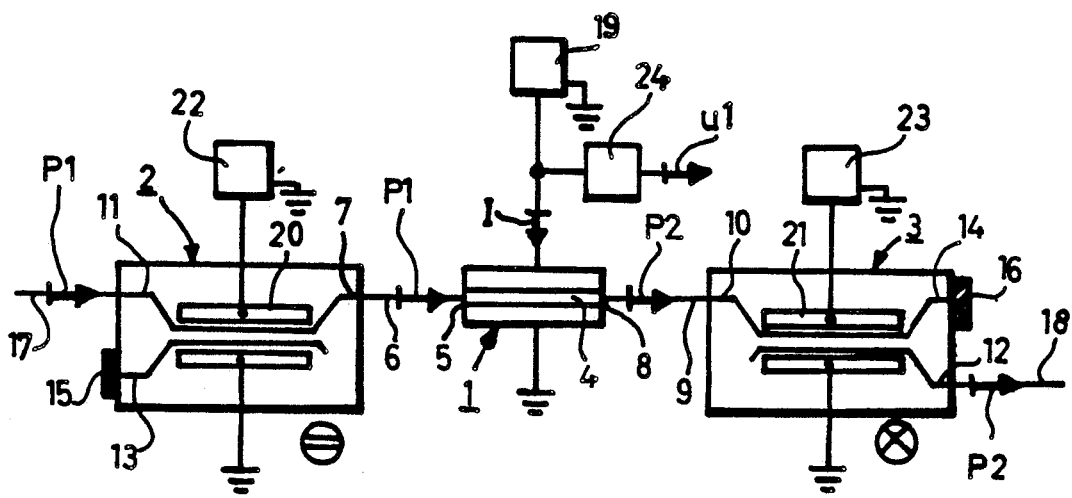
FIG. 1 illustrates the arrangement in its light signal receiving mode.

An examplifying embodiment of the inventive arrangement is illustrated in FIG. 1. The arrangement includes a first laser diode 1, a first directional coupler switch 2 and a second directional coupler switch 3. The first laser diode includes an optical waveguide 4, one end surface 5 of which is connected, by means of an optical fibre 6, to a first optical connection 7 tat one end of the coupler switch 2. The waveguide 4 of the laser diode has another end surface, referenced 8, which is correspondingly connected, by means of an optical fibre 9, to a first optical connection 10 at one end of the directional coupler switch 3. The respective other ends of each directional coupler witches 2 and 3 have respective second connections 13 and 14, each of which is provided with a respective mirror 15 and 15, and respective third connections 11 and 12. Each connection 11, 12 is connected to a respective optical fibre 17 and 18 included in an optical communication system.

The first laser diode 1 is a travelling wave amplifier and the end surfaces 5 and 8 of the diode have reflection-inhibiting coatings which exhibit a reflectance in the order to $10^{-3}$. Laser amplifiers of this kind are found described in an article by S. Kobayashi and T. Kimura published in IEEE Spectrum, May 1984, pages 26–33, and entitled "Semiconductor optical amplifiers". This article also discloses the fact that a laser diode, such as the laser diode illustrated in FIG. 1, can function both as an amplifier for incoming light signals and as a light transmitting laser. This latter function is achieved when the drive current has a value which lies above a given threshold value, the lasering threshold, and the laser diode possesses a feedback function by virtue of the fact that its end surfaces are reflective. When the drive current value lies beneath the lasering threshold or the laser diode has no reflective end surfaces, the laser diode will function solely as an amplifier.

/the first laser diode 1 in FIG. 1 is supplied with drive current I from a drive source 19, which is connected over electrodes of the laser diode, so that said light amplification can take place.

The directional coupler switches 2, 3 are conventional switches and are found described, for instance, in IEEE, Transactions on Circuits and Systems, Vol. CAS-26, No. 12, December 1979, pages 1099-1108., Ronald V. Schmidt and Rod C. Alferness; "Directional Coupler Switches, Modulators and Filters Using Alternating ΔB Techniques". The directional coupler switches include respective electrodes 20 and 21 to which respective voltage sources 22 and 23 are connected for the purpose of setting the coupler switches to desired coupling states, for instance a cross state or a bar state, these two states constituting the terminal positions of the directional coupler switches.

The inventive arrangement has two main states, these being a receiving and amplifying state and a light generating state for transmission purposes. The receiving and amplifying state is described below with reference to FIG. 1.

An incoming light signal P1 is amplified in the following manner. The directional coupler switch 2 is set to its bar state, marked with a , with the aid of the voltage source 22, and the directional coupler switch 3 is set to its cross state, marked with a symbol , with the aid of the voltage source 23. The lightwave P1 entering on the optical fibre 17 is coupled by the switch 2 to the connection 7 and passes through the optical fibre 6 and onto one end surface 5 of the optical waveguide 4 of the laser diode 1. The laser diode, which is supplied with the drive current I and has an amplification factor G, amplifies the light signal P1 and emits the light signal P2=G×P1. The light signal P2 passes through the optical fibre 9 and to the connection 10 of the directional coupler switch 3. The light signal is switched to the connection 12 of the coupler switch 3, by said switch, and the amplified light signal P2 is delivered to the optical fibre 18. As before mentioned, the laser diode 1 is a travelling wave amplifier whose end surfaces have been reflection-inhibiting layers. Consequently, no significant reflection of the light signal P1 back to the fibre 17 will take place, and neither will any light be reflected within the waveguide 4. The light signal P1 can be detected with the aid of the laser diode 1 at the same time as said amplification takes place, as described in the aforesaid article by A. Alping et al in Electronics Letters. When the luminance of the light signal P1 varies, the charge carrier concentration in the laser diode will also vary, which in turn results in a variation in the transmission voltage over the first laser diode 1. This voltage variation can be detected by a receiver 24, which is operative to produce an electric output signal U1 corresponding to the incoming light signal P1. It should be observed that the arrangement illustrated in FIG. 1 is symmetrical, insomuch that a light signal entering on the fibre 18 is amplified and detected in the laser diode 1 in a corresponding manner to the light signal P1, and is delivered to the fibre 17.

The aforementioned light generating state for transmission by the laser arrangement will now be described with reference to FIG. 2. The directional coupler switch 2 is set to its cross state with the aid of the voltage source 22, this state being marked with the symbol , in the figure. The directional coupler switch 3 is set to an intermediate state between its crosstate and it bar state with the aid of the voltage source 23, this intermediate state being marked with the symbols in said figure. When the direction coupler switches are set to the aforesaid states, the mirrors 15 and 16 define and extended cavity which contains the laser diode 1. A lightwave P3 sent by the laser diode 1 to the directional coupler switch 2 is transferred between the waveguide of the coupler switch, reflect in the mirror 15 and again transferred in the coupler switch 2 to the connection 7 of said switch. The lightwave P3 passes the waveguide 4 of the first laser diode 1, where the lightwave is amplified and sent to the directional coupler switch 3. Part of the amplified lightwave is transferred in the directional coupler switch 3 between the coupled waveguides and is transmitted via the connection 12. The remaining part of the lightwave is bar coupled to the mirror 16, reflected by the mirror and is coupled back, in part, to the laser diode 1, where it is again amplified. A powerful lightwave is created in this way in the extended cavity and part of this lightwave is transmitted via the connection 12 of the coupler switch 3. It will also be observed that the laser arrangement is symmetrical, also in this respect. By setting the directional coupler switch 3 to its bar state and the directional coupler switch 2 to an intermediate state, between the terminal positions, a lightwave is transmitted from the connection 11 of the coupler switch 2. Alternatively, both of said directional coupler switches 2 and 3 can be set to intermediate states between their respective terminal positions, in which case lightwaves will be transmitted from the third connection 11 and 12 of said two coupler switches. Lasering occurs when the current I delivered by the drive source 19 has a value which exceeds the aforesaid threshold value.

When the laser arrangement is in its light generating mode or state, the transmitted lightwave is modulated to form an information-carrying light signal. FIG. 3 shows the arrangement connected to a modulator 25 in which the drive current I is modulated. The modulator 25 and the voltage sources 22 and 23 are connected to a synchronizing circuit 26, by means of which the arrangement is switched between the receiving and amplifying state and the light generating state. The laser arrangement of the FIG. 3 embodiment is set to its light generating state with the aid of the coupler switches 2 and 3, as described above with reference to FIG. 2. The modulator 25 has an input to which a modulator control signal U2 is applied. The drive current I is modulated between a value which exceeds the lasering threshold and a value which lies beneath said lasering threshold. No amplification of light takes place in the cavity formed between the mirrors 15 and 16 when the drive current I has its low value, and the intensity level of the outgoing light is negligible. When the drive current I has its high value, a light pulse is transmitted in the manner described with reference to FIG. 2. The light pulses, together with their respective pulse-interspaces, form a second light signal P4 corresponding to the signal U2. In the aforesaid alternative state, with both coupler switches 2 and 3 in their intermediate states, light signals are transmitted from the third connections 11 and 12 respectively, of both directional coupler switches. In the case of the embodiment illustrated in FIG. 3, the voltage sources 22 and 23 may be relatively slow, since they are used solely to adjust the laser arrangement between its two main states.

Figure 2:
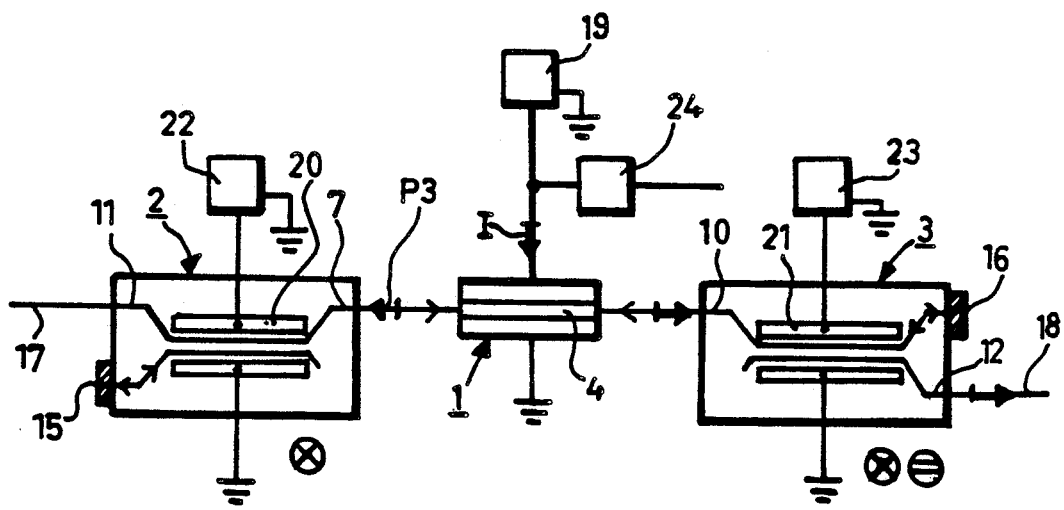
FIG. 2 illustrates the arrangement in its light transmitting mode.
Figure 3:
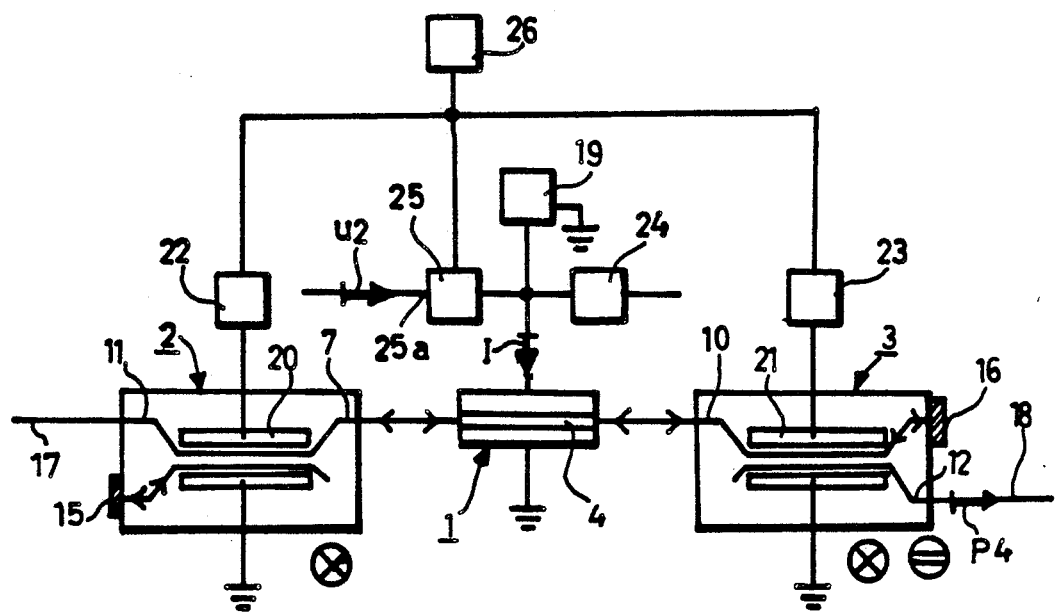
FIG. 3 illustrates the laser arrangement connected to a first modulation device for transmitting a light signal.
Figure 4:
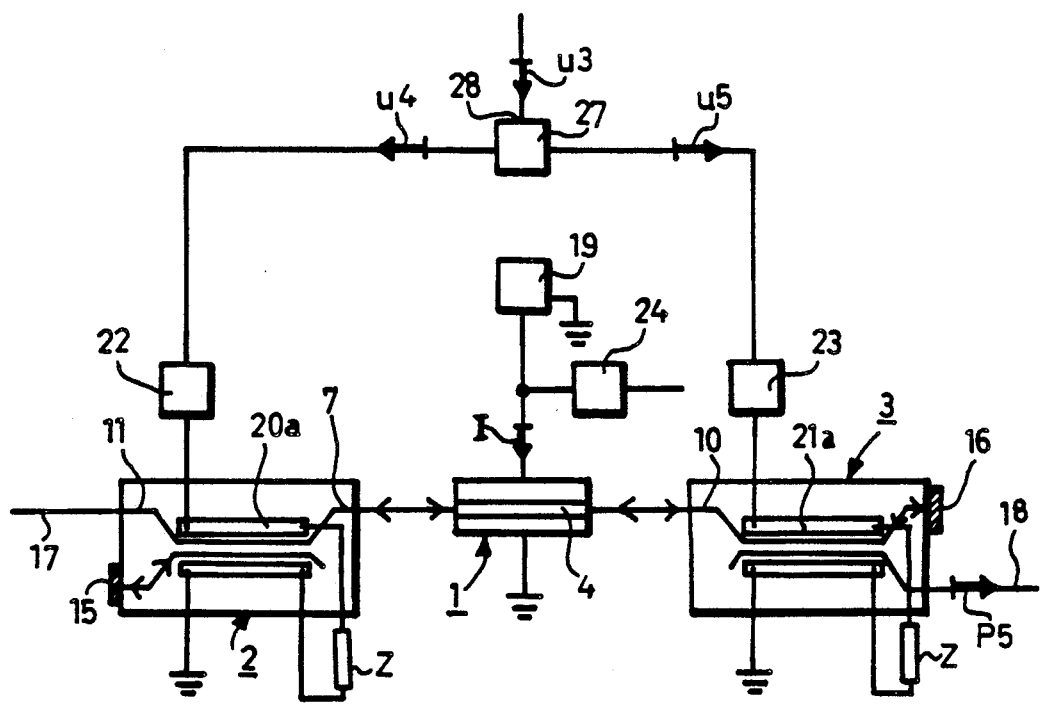
FIG. 4 illustrates the laser arrangement connected to an alternative modulation device for transmitting a light signal.

FIG. 4 illustrates the laser arrangement of FIG. 2 connected to an alternative device for modulating an output lightwave. Each of the voltage sources 22 and 23 is connected to a respective output of a modulator 27. The modulator has an input 28 to which a modulator-controlling signal U3 is connected. The modulator produces a signal U4 for modulating the voltage source 22 and also a signal U5, synchronously with the signal U4, for modulating the voltage source 23. The directional coupler switch 2 is modulated in this way between its terminal positions and the directional coupler switch 3 is modulated between its cross state and the intermediate state between the terminal states or switch positions. The drive current I has a value which exceeds the lasering threshold so that light amplification takes place and alight pulse is transmitted during the modulating phase when the mirrors 15 and 16 enclose the laser diode 1 in the extended cavity. In the opposite modulating phase, when the mirrors 15 and 16 are disconnected from the laser diode 1 by the directional coupler switches 2 and 3, no light will be transmitted. The light pulses, together with their respective interpaces, from a third light signal P5 which corresponds to the signal U3. Alternatively, the directional coupler switch 2 can also be modulated between one of its terminal positions, the cross state, and the intermediate position between its positions, wherewith light signals are transmitted both to the fibre 17 and to the fibre 18. Light signals can also be transmitted by modulating solely one of the coupler switches 2 or 3 in the modulating device of FIG. 4. In the case of the FIG. 4 embodiment, the voltage sources 22 and 23 are rapid, such as to enable said sources to be modulated with high frequency and consequently the transmitted light signal P5 will also have a high frequency. In FIG. 4, the directional coupler switches 2 and 3 have been shown to include travelling wave electrodes 20a and 21a for high frequencies. The electrodes are terminated through an impedance Z, in a reflection-free manner.

The aforedescribed laser arrangement illustrated in FIG. 1 comprises discrete optical components, a laser diode 1 and two directional coupler switches 2 and 3. Alternatively, the arrangement may be constructed entirely from integrated optics, with the optical components located on one and the same substrate. In this case, layers of desired compositions are grown by known methods within desired regions on the substrate, and a laser diode, corresponding to the laser diode 1, and two directional coupler switches, corresponding to the switches 2 and 3, are produced. A continuous waveguide, corresponding to the waveguides 11, 7, 6, 4, 9, 10 and 14, is herewith produced. In this integrated embodiment, the waveguides of the laser diode lack end surfaces corresponding to the surfaces 5 and 8, and problems relating to reflection at the ends of the laser diode are avoided. Coupling losses at the ends of the optical fibre 6 and 9 are also avoided.

An alternative embodiment of the invention is described below with reference to FIG. 5. In the case of this embodiment, the laser arrangement has two optical switch or coupling devices 30 and 31, illustrated schematically in the figure. Each of these devices includes a waveguide arrangement, including a first connection 32 and a bifurcate branch 33 through which a second 34 and a third connection 35 is connected to the first connection 32. The second connection 34 incorporates an optically reflective member 36, corresponding to respective mirrors 15 and 16, and the waveguide arrangement has a second laser diode 37 of the waveguide between the second connection 34 and the branch 33. Each of the first connections 32 of the switch devices 30 and 31 is connected to a respective end of the waveguide 4 of the first laser diode 1, through the optical fibres 6 and 9 respectively. Third connection 35 is connected to the optical channel of the communication system, in the illustrated example to the optical fibres 17 and 18 respectively. The first laser diode 1 is connected to the drive source 19 and the receiver 24 and the second laser diode 37 are connected to respective further drive sources 38.

When the laser arrangement is in its receiving and amplifying state, or mode, the incoming lightwave P1 is amplified and detected in a manner corresponding to that described with reference to FIG. 1. In this case, no current flows through the second laser diode 37 of the two switch devices 30 and 31. Part of the light, which passes through the arrangement, is conducted away in the branches 33 and is dampened out totally in the currentless laser diodes 37. An amplified light signal P6 is transmitted from the laser arrangement and the receiver 24 transmits the signal U1 corresponding to the incoming light signal P1.

Figure 6:
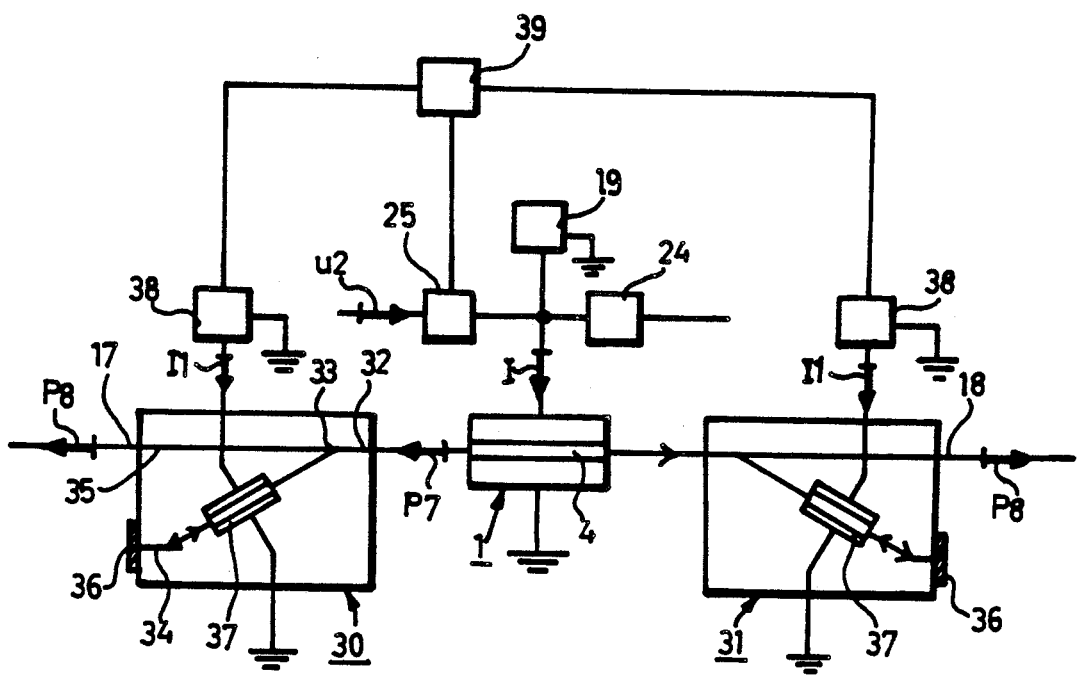
FIG. 6 illustrates the alternative arrangement connected to a modulation device for transmission of a light signal.

When the laser arrangement is in its light generating state, the two optical couplers or switches 30 and 31 are reset with the aid of a control circuit 39, which is illustrated in FIG. 6. The control circuit 39 sends signals to the drive sources 38, which deliver a drive current I1 to the laser diodes 37. The value of the drive current I1 is such that the laser didoes 37 are in their transparent state and the second connection 34 of the switch devices 30 and 31 are connected optically with the first laser diode 1. The optically reflective devices 36 define a cavity which contains the first laser diode 1. This laser diode is powered by the drive current I and emits the lightwave P7, which is amplified in the cavity in the manner described with reference to FIG. 2. The subsequently amplified lightwave is divided in the branches 33, and a lightwave P8 is sent to each of the optical fibres 17 and 18.

The lightwave P8 can be modulated to form an information carrying signal. This modulation can be effected, by resetting the modulator 25, with the aid of the control circuit 39, and modulating the drive current I from the first drive source 19 in the manner described with reference to FIG. 3. The modulator receives the signal U2 and the emitted, modulated light signal on the optical fibres 17 and 18 corresponds to the signal U2. Alternatively, the lightwave P8 can be modulated, by modulating the drive current I1 to the second laser diode 37 of either one, preferably both, of the switch devices 30 and 31. When modulating the drive current I1, the laser didoes 37 are switched between the transparent and non-transparent state. This results in the first laser diode 1 being connected to and disconnected from the cavity between the optically reflective devices 36. The drive current I excess the lasering threshold of the laser diode 1 and the laser arrangement emits a light pulse when the laser diode is connected in the cavity.

When modulating the laser arrangement in FIG. 6, the value of the drive current I1 to the laser diode 37 aforedescribed has only been such as to bring the laser diodes to their transparent state. Amplification in the cavity is increased by increasing the drive current I1 to a value above the lasering threshold.

Figure 5:
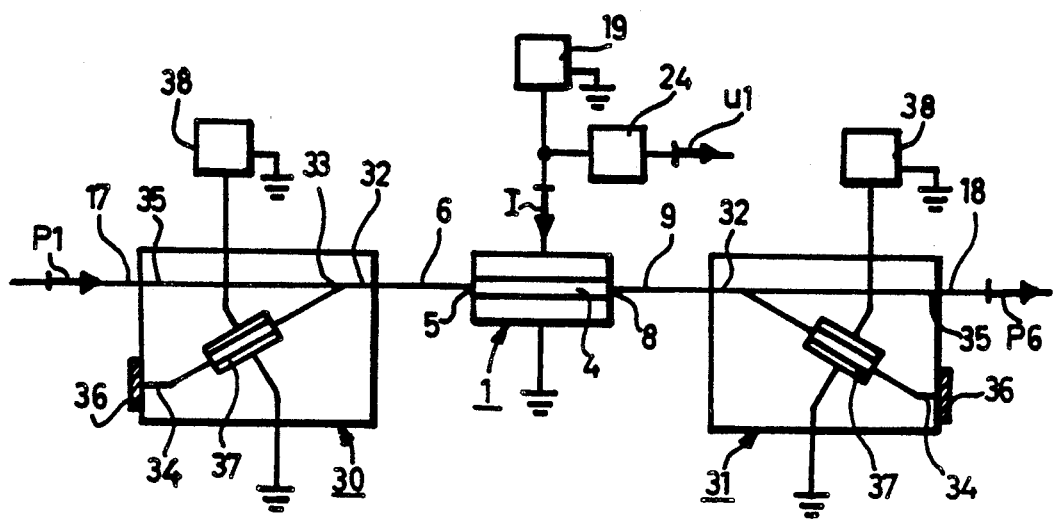
FIG. 5 illustrates an alternative arrangement of the invention in its light signal receiving mode.

Although the laser arrangement illustrated in FIGS. 5 and 6 includes descrete components, the arrangement can, just as the arrangement illustrated in FIG. 1, be constructed from integrated optics on one and the same substrate. This is an advantageous embodiment for the arrangement according to FIGS. 5 and 6 with three laser diodes, which can be readily produce on the common substrate.

The transmission medium of the aforedescribed embodiments i optical fibres, although it will be understood that other media, for instance vacuum, can also be used to this end. The directional coupler switches 2 and 3 of the described embodiments have mirrors 15 and 16 respectively located at respective second connections 13 and 14. These mirrors can be replaced with semi-transparent, reflective coatings or may solely comprise untreated waveguide end surfaces having a given optical reflectance.

The laser arrangement according to the present invention has several advantages over the known technique. The arrangement is simple and one and the same laser diode is used for the three functions of the arrangement, i.e. amplification, detection and transmission. The reflection of optical signals emitted by the laser diode, back along the input channel is avoided and signals can be transmitted in a desired direction, or in both directions simultaneously.

I claim:
1. An optical communications apparatus comprising:
first laser diode means including a coherent light source, first and second low-reflectance faces and an optical waveguide;
an optical communications channel;
a first optical reflector;
first optical coupling means for selectively intercoupling said first low-reflectance face of said laser diode means to one of said optical communications channel and said first optical reflector;
a second optical reflector; and
second optical coupling means for selectively intercoupling said second low-reflectance face of said laser diode means to one of said optical communications channel and said second optical reflector;
said first optical coupling means, said laser diode means, and said second optical coupling means providing for selective intercoupling of said first optical reflector and said second optical reflector.

2. An optical communications apparatus according to claim 1, wherein the first and second optical coupling means including directional coupler switches connected to optical waveguides and electrodes in a coupling range.

3. An optical communications apparatus according to claim 1, wherein the first and second optical coupling means each includes an optical waveguide arrangement and a second laser diode means, and each selectively intercouples said low-reflectance face to one of said optical communications channel and said optical reflector via a bifurcate branch of said waveguide arrangement, said second laser diode being connected between one branch of said bifurcate branch and said optical reflector.

4. An optical communications apparatus according to claim 1, in which the first laser diode means has electrodes to which a drive source and a receiver are connected in order to amplify, through a drive current, and to detect a light signal in said optical communications channel passing the waveguide of the first laser diode means, wherein control devices are connected to the first and second optical coupling means for resetting the optical communications apparatus between a receiving and amplifying state and a light generating state; wherein, in the receiving and amplifying state, the first and second optical coupling means are set to positions such that they intercouple said first and second low-reflectance faces of said first laser diode means with said optical communications channel and prevent intercoupling of the optical waveguide of said first laser diode means and at least one of said first and second optical reflectors such that said light signal can be detected and amplified in the first laser diode means; and wherein, in the light generating state, the first and second optical coupling means are set to positions such that they intercouple both of said optical reflectors and said optical communications channel with the optical waveguide of said first laser diode means so that the laser diode means, with the aid of the drive source, is able to transmit light in at least one direction along the optical communication channel.

5. An optical communications apparatus according to claim 4, wherein when the optical communications apparatus is in its light generating state, the transmitted light is modulated to form an information carrying light signal, by modulating the drive current to the first laser diode means with the aid of a modulator connected to the laser diode means.

6. An optical communications apparatus according to claim 4, wherein the transmitted light is modulated to form an information carrying light signal by activation of the first and second optical coupling means by the control devices, said first and second optical coupling means modulating the optical communications apparatus between its light generating state and a non-light generating state in which the optical connection between the first laser diode means and at least one of the optical reflectors is broken.

* * * * *